United States Patent
Suzuki

(10) Patent No.: US 8,243,968 B2
(45) Date of Patent: Aug. 14, 2012

(54) FLAT-PANEL TELEVISION AND AUDIO EQUIPMENT

(75) Inventor: Hirotsugu Suzuki, Osaka (JP)

(73) Assignee: Funai Electric Co., Ltd., Daito-shi, Osaka (JP)

( * ) Notice: Subject to any disclaimer, the term of this patent is extended or adjusted under 35 U.S.C. 154(b) by 1146 days.

(21) Appl. No.: 12/079,653

(22) Filed: Mar. 28, 2008

(65) Prior Publication Data

US 2008/0240469 A1    Oct. 2, 2008

(30) Foreign Application Priority Data

Apr. 2, 2007   (JP) ................... 2007-096465

(51) Int. Cl.
*H04B 15/00* (2006.01)
(52) U.S. Cl. .................. 381/306; 381/94.7; 348/794
(58) Field of Classification Search ............... 381/306, 381/94.7; 348/794
See application file for complete search history.

(56) References Cited

U.S. PATENT DOCUMENTS

| | | | | |
|---|---|---|---|---|
| 3,825,697 | A * | 7/1974 | Cornell et al. | 381/4 |
| 3,894,201 | A * | 7/1975 | Pyles | 369/47.16 |
| 3,969,675 | A * | 7/1976 | Gosling | 455/46 |
| 5,103,675 | A * | 4/1992 | Komninos | 73/592 |
| 2005/0207725 | A1* | 9/2005 | Sako et al. | 386/46 |
| 2007/0230718 | A1* | 10/2007 | Oda | 381/117 |

FOREIGN PATENT DOCUMENTS

| | | |
|---|---|---|
| JP | 07-013643 | 1/1995 |
| JP | 07-078941 | 3/1995 |
| JP | 2000-047848 | 2/2000 |
| JP | 2002-150723 | 5/2002 |

* cited by examiner

*Primary Examiner* — Steven J Fulk
(74) *Attorney, Agent, or Firm* — Yokoi & Co., U.S.A., Inc.; Toshiyuki Yokoi

(57) ABSTRACT

Disclosed is an audio equipment, comprising: an audio output amplifier and a speaker, with a sound output from the speaker based on an audio signal that is input in the audio output amplifier, and with a high signal output as an error signal to protect the audio output amplifier when an abnormal operation occurs. The audio equipment further comprising a rectifier circuit to stabilize the error signal.

3 Claims, 3 Drawing Sheets

FLAT-PANEL TELEVISION AND AUDIO EQUIPMENT

CROSS-REFERENCES TO RELATED APPLICATIONS

The present application is related to the Japanese Patent Application No. 2007-96465, filed Apr. 2, 2007, the entire disclosure of which is expressly incorporated by reference herein.

BACKGROUND OF THE INVENTION (1) Field of the Invention

The present invention relates to a flat-panel television and audio equipment, more particularly, to audio equipment, which outputs an error signal when an abnormal operation occurs, and a flat-panel television provided with the audio equipment.

(2) Description of Related Art

A flat-panel television apparatus includes, for example, audio equipment, which outputs a sound from a speaker based on a sound signal that is input in an audio output amplifier IC. Some type of this audio output amplifier IC outputs a high signal as an error signal when abnormalities, such as output short, thermal shutdown, reduced voltage detection, and instantaneous interruption detection, for example, occur. It is well known that such an error signal is used for a countermeasure against heating or the like for protecting the audio output amplifier IC and other devices when an abnormal operation occurs, by shutting off the power supplied to the audio equipment to turn off the power of the flat-panel television apparatus when the high signal is output.

FIG. 3 is a schematic diagram showing an example of a portion related to shutting off the power that is supplied to the audio equipment when an abnormal operation occurs in the flat-panel television apparatus. In FIG. 3, a power supply circuit 1 is a partial resonance power supply circuit; it converts an external power, for example, a commercial AC power into a plurality of types of predetermined voltages, and outputs the operating power voltages to all portions of the flat-panel television apparatus. Audio equipment 2 comprises mainly an audio output amplifier IC 2a that outputs a sound from a speaker 2b based on an audio signal and a constant voltage circuit 2c that output a constant voltage to the audio output amplifier IC 2a. This audio output amplifier IC 2a outputs a high signal as an error signal when abnormalities, such as output short, thermal shutdown, reduced voltage detection, and instantaneous interruption detection, for example, occur. When the high signal is continuously input for a predetermined time, a microcomputer 3 judges that the system is in an abnormal state, and outputs an OFF signal Poff in place of an ON signal Pon as a signal to order ON/OFF of the power supply circuit 1. Thereby, the power supply circuit 1 is turned off, and the outputs of all the operating voltages are stopped, enabling to protect the audio output amplifier IC and other parts from heating due to the abnormal state.

Japanese Unexamined Patent Application Publication No. Hei7 (1995)-78941, discloses a system of an overheat protection circuit by means of a semiconductor integrated circuit (IC), wherein it includes a shutoff circuit that stops the operations of a temperature monitoring circuit and other main circuits in the IC chip according to the output of the detected temperature, and the shutoff circuit includes a timer circuit section, whereby the system judges whether or not the signal of the temperature monitoring circuit is high for more than a predetermined time, and stops the operation of the main circuit after judging that the signal is high for more than a predetermined time.

Japanese Unexamined Patent Application Publication No. Hei7 (1995)-13643 discloses a system of an overheat protection circuit, wherein it does not output a shutoff signal even if a malfunction occurs in the shutoff circuit when it turns on or off the power under a high temperature condition due to the degradation of the heat dissipation efficiency.

Japanese Unexamined Patent Application Publication No. 2000-47848 discloses an audio output control system, wherein it automatically returns to the normal operation without performing any external manipulations even if the sound synthesis IC runs out of control.

In addition, in Japanese Unexamined Patent Application Publication No. 2002-150723, there is disclosed a signal processing unit of audio equipment comprising: a multi-channel decoder (MCD) or a digital interface receiver (DIR), a digital signal processor (DSP), and a microcomputer as an integrated circuit (IC); wherein a forcible mute circuit, which acts like an AND circuit by forcibly zeroing the output signal of the DSP according to the error detection data that is output from the MCD or DIR and muting the circuit, is provided in the latter part of the DSP.

Hereby, in order to prevent the control operation at the abnormal state from becoming unstable as far as possible due to the effect of noise or the like, and due to the phenomenon that the error signal oscillates irregularly between high (H) and low (L) caused by such as the load short and the short between pins in the IC or other similar devices, it is normally carried out to turn off the power by judging that the system is in an abnormal state when the error signal remains a high signal for a predetermined time as described above.

Therefore, because the system is not judged as an abnormal state and the power is not turned off when a halfway abnormal operation occurs such as when the signal oscillates between high (H) and low (L) caused by such as the load short and the short between pins in the IC or other similar devices, it was necessary to take measures against heating by assuming the heating beforehand when such the halfway abnormal operation occurred. For example, it was necessary to decrease the temperature by providing a radiation plate so that the heating temperature becomes lower than a prescribed value even if the power consumption is increased or by increasing the resistance value of a resistor 2d as shown in FIG. 3 so that the resistor can withstand even if the power consumption is increased. Such measures against heating were an excess quality except when the halfway abnormal operation occurs, and could cause the cost up of the system. Effective measures against heating when the halfway abnormal operation occurs have not been proposed yet.

BRIEF SUMMARY OF THE INVENTION

The present invention is made by taking the above-described problem into consideration, and it presents audio equipment that can prevent the continuation of the halfway abnormal operations and a flat-panel television provided with the audio equipment.

In order to solve the problem, one embodiment of the present invention includes an audio equipment, comprising: an audio output amplifier and a speaker, with a sound output from the speaker based on an audio signal that is input in the audio output amplifier, and with a high signal output as an error signal to protect the audio output amplifier when an abnormal operation occurs. The audio equipment further comprising a rectifier circuit to stabilize the error signal.

These and other features, aspects, and advantages of the invention will be apparent to those skilled in the art from the following detailed description of preferred non-limiting exemplary embodiments, taken together with the drawings and the claims that follow.

BRIEF DESCRIPTION OF THE DRAWINGS

It is to be understood that the drawings are to be used for the purposes of exemplary illustration only and not as a definition of the limits of the invention. Throughout the disclosure, the word "exemplary" is used exclusively to mean "serving as an example, instance, or illustration." Any embodiment described as "exemplary" is not necessarily to be construed as preferred or advantageous over other embodiments.

Referring to the drawings in which like reference character(s) present corresponding parts throughout.

DETAILED DESCRIPTION OF THE INVENTION

Figure 1:
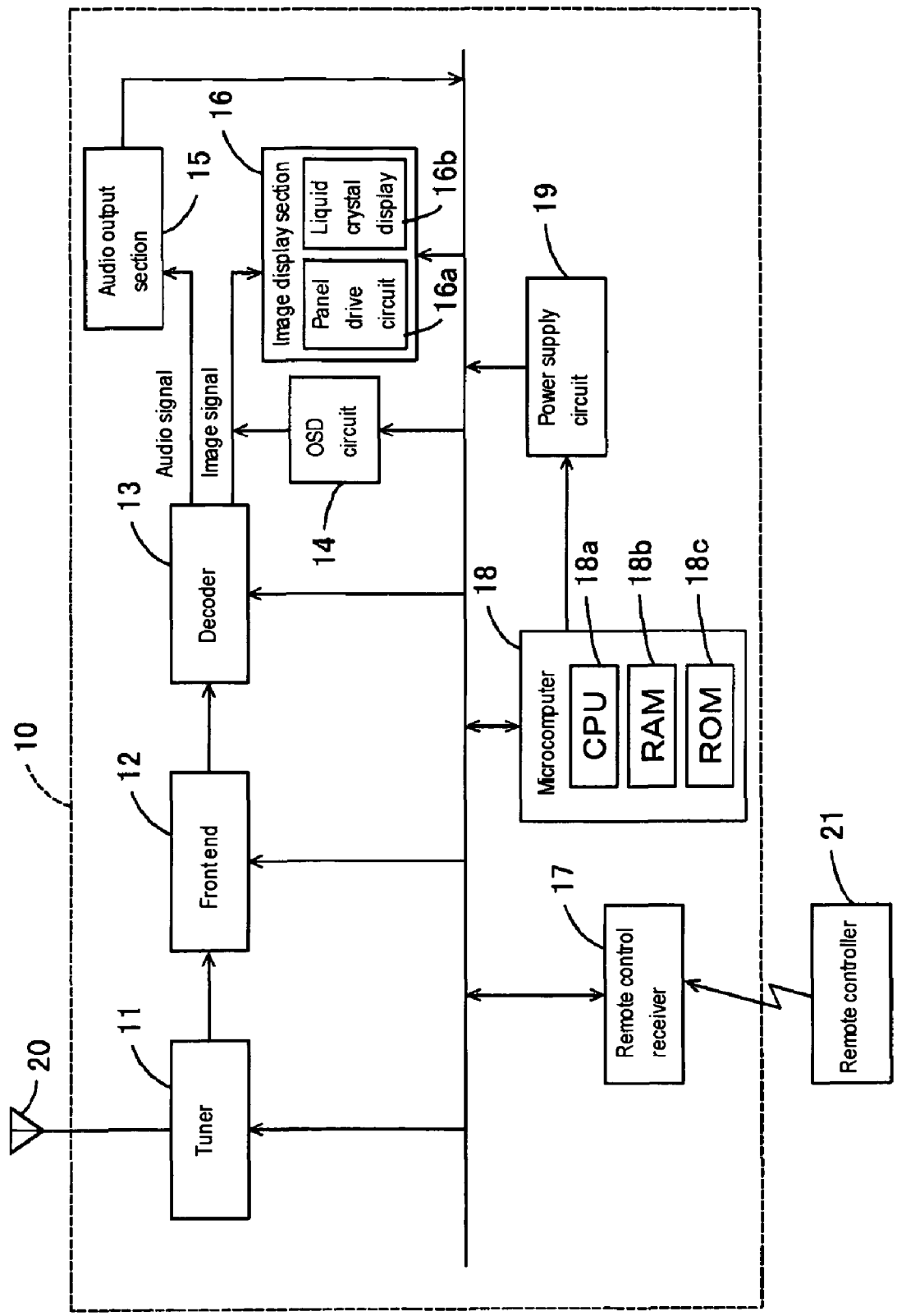
FIG. 1 is a block diagram illustrating the configuration of a liquid crystal television apparatus to which the present invention is applied.

Hereinafter, a preferred embodiment of the present invention will be explained in detail following the items described below with reference to the accompanying drawings.
(1) Configuration of a liquid crystal television apparatus
(2) Concrete configuration of audio equipment
(3) Conclusion
(1) Configuration of a Liquid Crystal Television Apparatus FIG. 1 is a block diagram illustrating the configuration of a liquid crystal television apparatus 10 as a flat-panel television to which the present invention is applied. In FIG. 1, the liquid crystal television apparatus includes a tuner 11, a front end 12, a decoder 13, an OSD circuit 14, an audio output section 15, an image display section 16, a remote control receiver 17, a microcomputer 18, and a power supply circuit 19.

The tuner 11, which is connected, for example, to an antenna 20, gets a television broadcast signal corresponding to one channel (for example, a channel selected by the user) among the television broadcast signals received by the antenna 20 following the control signal that is input from the microcomputer 18, and outputs the signal to the front end 12.

The front end 12 converts the television broadcast signal, which is output from the tuner 11 following the control signal that is input, for example, from the microcomputer 18, into an intermediate frequency signal, and outputs the signal to the decoder 13.

The decoder 13 separates the intermediate frequency signal into the audio signal and the image signal, and decodes them by applying the processing according to the predetermined file format (for example, the well-known MPEG-2 format or the like) for the intermediate frequency signal that is output from the front end 12 following the control signal that is input, for example, from the microcomputer 18. And, the decoder outputs the decoded audio signal to the audio output section 15, as well as outputs the decoded image signal to the image display section 16.

The OSD circuit 14 merges the OSD display signal for performing a predetermined OSD display (on-screen display) on the image display section 16 into the image signal that is output from the decoder 13 to the image display section 16 following the control signal that is input, for example, from the microcomputer 18.

The audio output section 15 functions as audio equipment that outputs a sound according to the audio data based on the audio signal that is output from the decoder 13.

The image display section 16 includes, for example, a panel drive circuit 16a, a liquid crystal panel 16b, and other devices; and it displays an image according to the image data based on the image signal that is output from the decoder 13, and an image according to the image data based on the image signal that is output from the decoder 13 and merged with the OSD display signal by the OSD circuit 14.

The remote control receiver 17 receives various signals (control commands) that are transmitted, for example, from a remote controller 21, and outputs various data to the microcomputer 18 based on the various signals.

The remote controller 21 is operated, for example, by the user, and it transmits the signal corresponding to the operation to the remote control receiver 17. More specifically, the remote controller 21 includes channel keys, up/down keys, and other keys, which are used when the user specifies a channel to select or other purposes.

The microcomputer 18 includes, for example, CPU18a, RAM18b, ROM18c, and other parts; and it controls the liquid crystal television apparatus 10. For example, the microcomputer 18 controls the channel switching and the volume up/down based on the control commands received by the remote control receiver 17.

CPU18a performs various control operations following the various processing programs recorded in ROM18c for the liquid crystal television apparatus 10.

RAM18b includes a program storage area for unfolding the processing program to be executed by CPU18a, securing a data storage area for input data, and storing the processed results and other data that are produced when the processing programs are executed.

ROM18c records a system program that can be executed in the liquid crystal television apparatus 10, various processing programs that can be executed in the system program, data that can be used when executing these various processing programs, the data of various results that are processed by CPU18a, and other data. In addition, the programs are recorded in ROM18c in the format of loadable program code.

Figure 2:
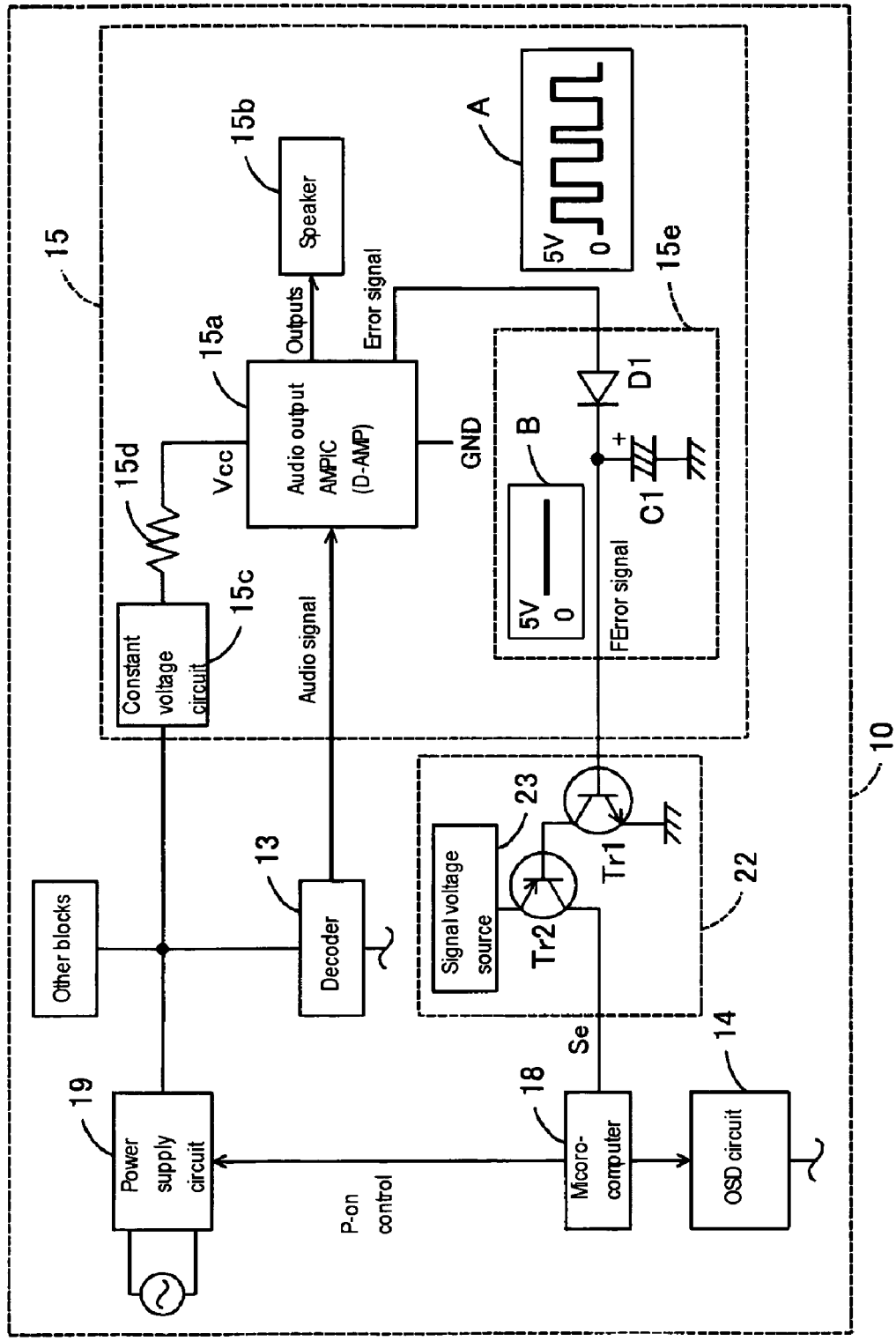
FIG. 2 is a schematic configuration diagram illustrating more concretely the portion of an audio output section as audio equipment in the liquid crystal television apparatus shown in FIG. 1.
Figure 3:
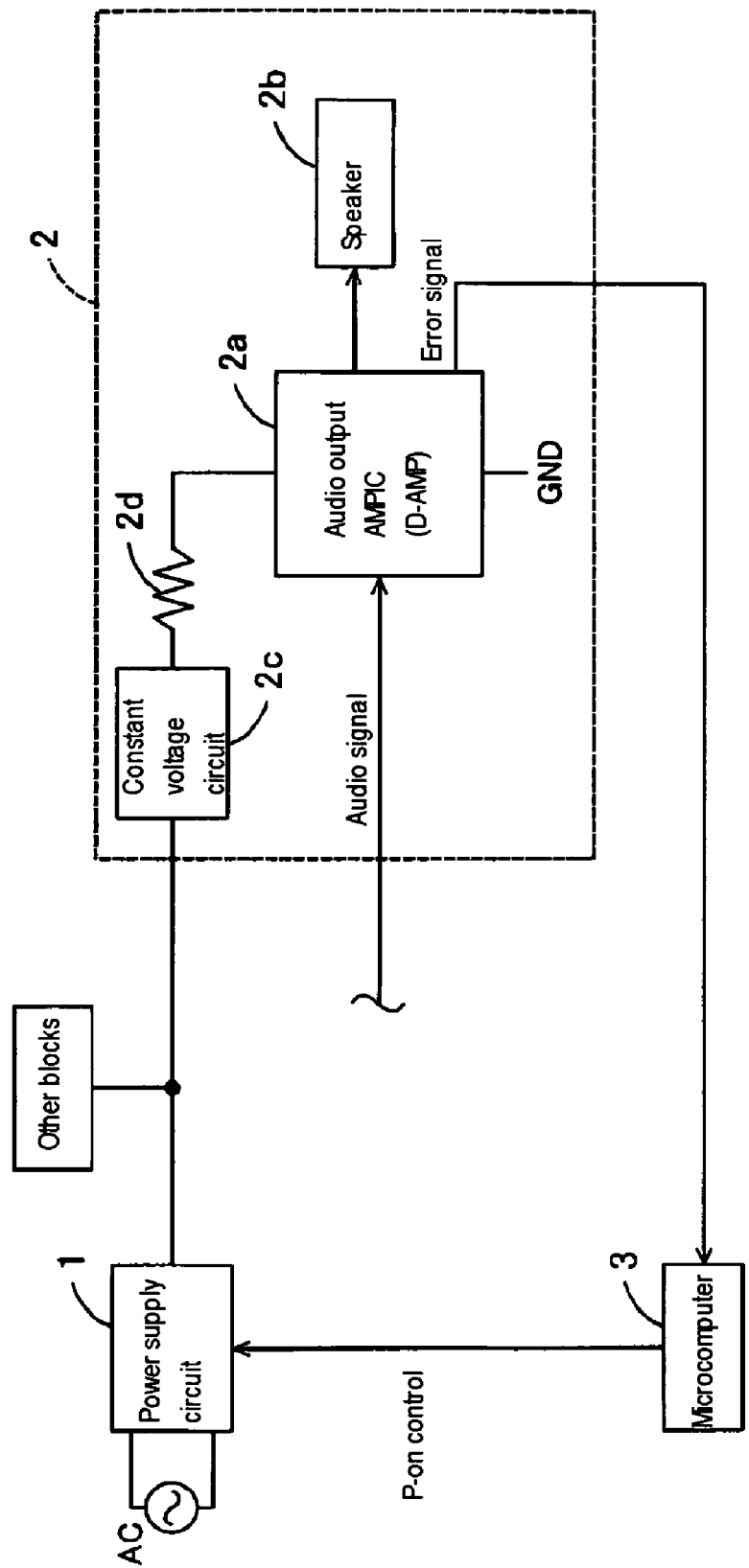
FIG. 3 is a schematic configuration diagram showing an example of the portion with which the power supplied to the audio equipment is shut off when an abnormal operation occurs in the conventional flat-panel television apparatus.

The power supply circuit 19 is, for example, a partial resonance power supply circuit; it converts a commercial AC power into a plurality of types of predetermined voltages and outputs the operating power voltages to all portions of the liquid crystal television apparatus.
(2) Concrete Configuration of Audio Equipment FIG. 2 is a schematic configuration diagram illustrating in more concrete form the portion on the audio output section 15 as audio equipment in the liquid crystal television apparatus 10 shown in FIG. 1. In FIG. 2, the audio output section 15 includes an audio output amplifier IC (D-AMP) 15a, a speaker 15b, a constant voltage circuit 15c that supplies a constant voltage Vcc to the audio output amplifier IC 15a based on the output voltage from the power supply circuit 19, a resistor 15d, a rectifier circuit 15e, and other devices.

The audio output amplifier IC 15a applies a predetermined processing such as power amplification to the audio signal that is input from the decoder 13, outputs the audio signal to the speaker 15b to output a sound from the speaker 15b. In addition, this audio output amplifier IC 15a outputs a high signal "H" as an error signal Error to protect the audio output amplifier IC 15*a* itself when abnormalities, such as output short, thermal shutdown, reduced voltage detection, and instantaneous interruption detection, for example, occur.

Hereby, in order to prevent the control operation of the microcomputer 18 from becoming unstable as far as possible due to the effect of noise or the like, and due to the phenomenon that the error signal Error oscillates irregularly between high and low when the halfway abnormalities, such as the load short and the short between pins in the audio output amplifier IC 15*a* or other similar devices, occur, it is considered to be possible to judge that the system is in an abnormal state when the error signal Error remains a high signal for a predetermined time. However, then the system is not judged as an abnormal state, and the measures against heating such as power off are not performed when a halfway abnormal operation occurs such as when the error signal Error oscillates between high and low, so it is necessary to take measures against heating for assuming the heating beforehand when such the halfway abnormal operation occurs, and this has a possibility to cause the cost up of the system. For this reason, the audio output section 15 in the present embodiment includes the rectifier circuit 15*e* to stabilize the error signal Error.

More specifically, the rectifier circuit 15*e* includes a diode D1 and a capacitor C1 whose one terminal is connected to the cathode side of the diode D1 and the other terminal is grounded. When the error signal Error is input in the anode side of the diode D1, the rectifier circuit 15*e* stabilizes the error signal Error by smoothing the signal and outputs the error signal after stabilization FError to the diode D1.

As mentioned above, by stabilizing the error signal Error by rectifying the signal by means of the rectifier circuit 15*e*, even if the error signal Error oscillates irregularly between high and low as shown at A in FIG. 2 when abnormal operations such as a load short and a short between pins occur, after stabilizing it, the averaged value of the error signal Error is output to the error signal after stabilization FError as shown at B in FIG. 2.

The error signal after stabilization FError, which is output from the rectifier circuit 15*e*, becomes a signal to activate an abnormality signal output circuit 22 that outputs an abnormal state detection signal Se to the microcomputer 18, for example, to turn off the power supply circuit 19 when the abnormal state occurs. For example, the abnormality signal output circuit 22 includes a first transistor Tr1 whose base is connected to the cathode side of the diode D1, and a second transistor Tr2 whose emitter is connected to a signal voltage source 23 of the abnormal state detection signal Se to detect the abnormal state and the collector is connected to the microcomputer 18; when the voltage of the error signal after stabilization FError becomes more than a predetermined voltage and the first transistor Tr1 is turn on, the second transistor Tr2 is also turned on and the error signal is output to the microcomputer 18 as the abnormal state detection signal Se.

For example, when the high signal is continuously input for a predetermined time, the microcomputer 18 judges that the audio equipment is in an abnormal state, and outputs the OFF signal Poff replaced with the ON signal Pon as a signal to direct on or off of the power supply circuit 19. Thereby, the power supply circuit 19 is turned off to shut off the power supplied to the audio output amplifier IC 15*a* and other devices, enabling to protect the audio output amplifier IC 15*a* and other devices from heating due to the abnormal state.

(3) Conclusion

As mentioned above, according to the present embodiment, because it includes the rectifier circuit 15*e* to stabilize the error signal, the rectifier circuit 15*e* smoothes the error signal Error to convert it into the error signal after stabilization FError even if the error signal Error that might oscillate irregularly between high and low is input in the rectifier circuit 15*e*; thereby enabling it to properly detect an abnormal state even when a halfway abnormal operation occurs such as when the error signal oscillates irregularly between high and low, and the power supplied to the audio output amplifier IC 15*a* is definitely shut off. In addition, because the error signal Error is stabilized, it becomes also possible to shorten the required time when the microcomputer 18 judges the abnormal state. With this, the system can detect the abnormal state of the audio output section 15 quickly and definitely, and prevent the continuation of the halfway abnormal operations. Therefore, it is possible to easily prevent the durability and quality of the parts of the audio output section 15 from degrading due to the continuation of the halfway abnormal operations without performing the measures against heating that become excessive quality except when the halfway abnormal operations occur. In addition, because the power supply control becomes able to be done with few false operations, the continuation of the halfway abnormal operations can easily be prevented.

In addition, according to the present embodiment, because the rectifier circuit 15*e* consists of the diode D1 and capacitor C1, it can easily smooth the error signal Error to covert it into the error signal after stabilization FError. It can easily convert the error signal Error that might oscillate between high and low, in particular, into a stable signal output.

In addition, according to the present embodiment, because the abnormal state detection signal Se, which is detected based on the condition that the error signal after stabilization FError for which the rectifier circuit 15*e* stabilizes the error signal Error is more than a predetermined voltage, is output to the microcomputer 18, when the microcomputer shuts off the power supplied to the audio output amplifier IC 15*a* based on the condition that the abnormal state detection signal Se are continuously input for a predetermined time, the microcomputer 18 can perform a stable power supply control with few false operations when a halfway abnormal operation occurs, and can easily prevent the continuation of the halfway abnormal operations.

In addition, according to the present embodiment, because the abnormal state detection signal Se, which is stabilized by the abnormality signal output circuit 22 based on the error signal after stabilization FError, the microcomputer 18 stably judges the abnormal state. Therefore, the stable abnormal state detection signal Se is output to the microcomputer 18 by the abnormality signal output circuit 22 when a halfway abnormal operation occurs, thereby enabling the microcomputer 18 to perform the power supply control with few false operations, and to easily prevent the continuation of the halfway abnormal operations.

As mentioned above, according to the audio equipment of the present invention, even if an error signal that might oscillate between a high signal and a low signal is input in the rectifier circuit, it can, for example, smooth the error signal to convert it into a stable signal. And because the error signal can be stabilized by the rectifier circuit, the system can properly detect the abnormal state even when a halfway abnormal operation occurs such as when the error signal oscillates between a high signal and a low signal.

Therefore, the system can detect the abnormal state of the audio equipment quickly and definitely, and prevent the continuation of the halfway abnormal operations. With this, it is possible to easily prevent the durability and quality of the parts of the audio equipment from degrading due to the continuation of the halfway abnormal operations without performing the measures against heating that become excessive quality except when the halfway abnormal operations occur.

Also, in another embodiment of the present invention, the rectifier circuit includes a diode and a capacitor with one terminal connected to a cathode side of the diode and an other terminal grounded; and when the error signal is input in an anode side of the diode, the error signal is rectified and output from the cathode side of the diode. According to this invention, even if an error signal that might oscillate between a high signal and a low signal is input in the rectifier circuit, it can easily rectify the error signal to convert it into a stable signal.

Also, in another embodiment of the present invention, the power supplied to the audio output amplifier is shut off based on the output from the rectifier circuit. According to this invention, the power supplied to the audio output amplifier is definitely shut off even when a halfway abnormal operation occurs such as when the error signal oscillates between a high signal and a low signal. Therefore, as it becomes possible to perform the power supply control with few false operations, the continuation of the halfway abnormal operations can easily be prevented.

Also, in another embodiment of the present invention, the abnormal state detection signal based on the condition that the output from the rectifier circuit is more than a predetermined voltage is output to the microcomputer. This microcomputer shuts off the power supplied to the audio output amplifier when the abnormal state detection signal is input continuously for a predetermined time. According to this invention, it becomes possible to perform the power supply control by means of the microcomputer stably even when a halfway abnormal operation occurs such as when the error signal oscillates between a high signal and a low signal. Therefore, as it becomes possible to perform the power supply control by means of the microcomputer stably with few false operations when a halfway abnormal operation occurs, the continuation of the halfway abnormal operations can easily be prevented.

Also, in another embodiment of the present invention, the error signal rectified by the rectifier circuit is output to the abnormality signal output circuit. This abnormality signal output circuit includes a first transistor with a base coupled with the cathode side of the diode, and a second transistor with a base grounded through the first transistor, an emitter coupled with a signal voltage source of the abnormal state detection signal, and a collector coupled with the microcomputer. When the output from the rectifier circuit becomes more than a predetermined voltage and the first transistor is turn on, the second transistor is also turned on, and a high signal as the abnormal state detection signal is output to the microcomputer. And when this high signal is input continuously for a predetermined time, the microcomputer shuts off the power supplied to the audio output amplifier by judging that the audio equipment is in an abnormal state. According to this invention, the judgment of an abnormal state by means of the microcomputer is stably performed even when a halfway abnormal operation occurs such as when the error signal oscillates between a high signal and a low signal. Therefore, when a halfway abnormal operation occurs, the stable above-described abnormal state detection signal is output to the microcomputer by means of the abnormality signal detection circuit; and as it becomes possible to perform the power supply control by means of the microcomputer with few false operations, the continuation of the halfway abnormal operations can easily be prevented.

The present invention can also be realized by using a flat-panel television for which the above-mentioned configuration takes a further concrete form; as a concrete example of the configuration, the flat-panel television of the present invention outputs a sound from a speaker based on an audio signal inputted in an audio output amplifier, and includes audio equipment that outputs a high signal as an error signal to protect the audio output amplifier when an abnormal operation occurs. This audio equipment includes a rectifier circuit to stabilize the error signal. This rectifier circuit includes a diode and a capacitor with one terminal connected to a cathode side of the diode and another terminal grounded; and when the error signal is input in an anode side of the diode, a stabilized signal is output by smoothing the error signal from the cathode side of the diode; the stabilized signal is output to an abnormality signal output circuit. This abnormality signal output circuit includes a first transistor with a base coupled with the cathode side of the diode, and a second transistor with a base grounded through the first transistor; an emitter coupled with a signal voltage source of an abnormal state detection signal to detect an abnormal state; and a collector coupled with a microcomputer; and when the voltage of the stabilized signal becomes more than a predetermined voltage and the first transistor is turn on, the second transistor is also turned on, and a high signal as the abnormal state detection signal is output to the microcomputer. When the high signal as the abnormal state detection signal is input continuously for a predetermined time, this microcomputer judges that the audio equipment is in an abnormal state, and shuts off the power supplied to the audio output amplifier.

In the flat-panel television of the present invention configured as described above, even if an error signal that might oscillate between a high signal and a low signal is input in the rectifier circuit, the rectifier circuit can smooth the error signal to convert it into a stable signal output. As mentioned above, because the error signal can be stabilized by the rectifier circuit, even when a halfway abnormal operation occurs such as when the error signal oscillates between a high signal and a low signal, the voltage of the signal after stabilization becomes more than a predetermined voltage; and when the first transistor is turn on, the second transistor is also turned on, and a high signal as the abnormal state detection signal is output to the microcomputer, thereby enabling it to detect the abnormal state properly. And the power supplied to the audio output amplifier is shut off definitely.

According to the present invention, by providing the rectifier circuit that stabilizes the error signal, the system can detect the abnormal state of the audio equipment quickly and definitely, and prevent the continuation of the halfway abnormal operations. With this, it is possible to easily prevent the durability and quality of the parts of the audio equipment from degrading due to the continuation of the halfway abnormal operations without performing the measures against heating that become excessive quality except when the halfway abnormal operations occur.

Also, it is possible to convert the error signal that might oscillate between a high signal and a low signal into a stable signal output.

Also, it becomes possible to perform the power supply control with few false operations, so the continuation of the halfway abnormal operations can easily be prevented.

Also, it becomes possible to perform the power supply control with few false operations using the microcomputer when a halfway abnormal operation occurs, so the continuation of the halfway abnormal operations can easily be prevented.

Also, when a halfway abnormal operation occurs, a stable above-described abnormal state detection signal is output to the microcomputer from the abnormality signal output circuit, and it becomes possible to perform the power supply control with few false operations using the microcomputer, so the continuation of the halfway abnormal operations can easily be prevented.

As mentioned above, some preferred embodiments of the present invention has been described in detail with reference to the accompanying drawings; however, the present invention is also applied to other forms of embodiments.

For example, in the embodiment described above, the power supply circuit 19 was turned off when the microcomputer 18 judged that the system is in a abnormal state; however, it is allowed that the power supply circuit 19 remains on, and, for example, only the constant voltage circuit 15c is turned off to shut off the power supplied to the audio output amplifier IC 15a. In this case, as the power supply circuit 19 remains on, it is also possible to perform the OSD display using the OSD circuit 14 showing that the power of the audio system is off and the audio output is presently stopped.

Also, in the embodiment described above, the power supplied to the audio output amplifier IC 15a was turned off by the power supply control using the microcomputer 18; however, it is allowed that the power supplied to the audio output amplifier IC 15a is turned off, for example, by activating the switching transistor based on the error signal after stabilization FError and directly controlling the power supply circuit 19 and the constant voltage circuit 15c. If this modification is applied to the embodiment described above, even when the microcomputer 18 becomes abnormal, the power supplied to the audio output amplifier IC 15a can be turned off definitely.

In addition, it should be understood that the foregoing relates to only a preferred embodiment on the invention, and that changes and variation may be made based on the knowledge of those skilled in the art without departing from the spirit and scope of the claims described in this invention.

While the invention has been particularly shown and described with respect to preferred embodiments thereof, it should be understood by those skilled in the art that the foregoing and other changes in form and detail may be made therein without departing from the spirit and scope of the invention as defined in the appended claims.

Although the invention has been described in considerable detail in language specific to structural features and or method acts, it is to be understood that the invention defined in the appended claims is not necessarily limited to the specific features or acts described. Rather, the specific features and acts are disclosed as preferred forms of implementing the claimed invention. Therefore, while exemplary illustrative embodiments of the invention have been described, numerous variations and alternative embodiments will occur to those skilled in the art.

It should further be noted that throughout the entire disclosure, the labels such as left, right, front, back, top, bottom, forward, reverse, clockwise, counter clockwise, up, down, or other similar terms such as upper, lower, aft, fore, vertical, horizontal, proximal, distal, etc. have been used for convenience purposes only and are not intended to imply any particular fixed direction or orientation. Instead, they are used to reflect relative locations and/or directions/orientations between various portions of an object.

In addition, reference to "first," "second," "third," and etc. members throughout the disclosure (and in particular, claims) is not used to show a serial or numerical limitation but instead is used to distinguish or identify the various members of the group.

What is claimed is:

1. An audio equipment, comprising:
   an audio output amplifier that amplifies an audio signal; and
   a speaker that outputs a sound based on the amplified audio signal;
   wherein
   the audio output amplifier outputs a high signal as an error signal to protect the audio output amplifier when an abnormal operation occurs;
   the audio equipment further comprises a rectifier circuit to stabilize the error signal that is output by the audio output amplifier;
   the rectifier circuit includes a diode;
   a power supplied to the audio output amplifier is shut off based on the output from the rectifier circuit;
   an abnormal state detection signal is output to a microcomputer based on a condition that the output from the rectifier circuit is more than a predetermined voltage;
   the microcomputer shuts off the power supplied to the audio output amplifier when the abnormal state detection signal is input continuously for a predetermined time;
   the error signal rectified by the rectifier circuit is output to an abnormality signal output circuit,
   the abnormality signal output circuit includes
     a first transistor with a base coupled with a cathode side of the diode, and
     a second transistor with a base grounded through the first transistor, an emitter coupled with a signal voltage source of the abnormal state detection signal, and a collector coupled with the microcomputer;
   when the output from the rectifier circuit becomes more than a predetermined voltage and the first transistor is turned on, the second transistor is also turned on and a high signal as the abnormal state detection signal is output to the microcomputer; and
   the microcomputer judges that the audio equipment is in an abnormal state and shuts off the power supplied to the audio output amplifier when the high signal is input continuously for a predetermined time.

2. The audio equipment according to claim 1, wherein the rectifier circuit includes a capacitor with one terminal connected to a cathode side of the diode and an other terminal grounded; and when the error signal is input in an anode side of the diode, the error signal is rectified and output from the cathode side of the diode.

3. A flat-panel television, comprising:
   an audio equipment having an audio output amplifier that amplifies an audio signal and a speaker that outputs a sound based on the amplified audio signal;
   the audio output amplifier outputs a high signal as an error signal to protect the audio output amplifier when an abnormal operation occurs;
   the audio equipment includes a rectifier circuit to stabilize the error signal that is output by the audio output amplifier;
   the rectifier circuit includes:
     a diode and a capacitor with one terminal connected to a cathode side of the diode and another terminal grounded;
   when the error signal is input in an anode side of the diode, a stabilized signal is output by smoothing the error signal from the cathode side of the diode;
   the stabilized signal is output to an abnormality signal output circuit;

the abnormality signal output circuit includes:
- a first transistor with a base coupled with the cathode side of the diode, and
- a second transistor with a base grounded through the first transistor; an emitter coupled with a signal voltage source of an abnormal state detection signal to detect an abnormal state; and a collector coupled with a microcomputer;

when the voltage of the stabilized signal becomes more than a predetermined voltage and the first transistor is turned on, the second transistor is also turned on and a high signal as the abnormal state detection signal is output to a microcomputer; and the microcomputer, when the high signal as the abnormal state detection signal is input continuously for a predetermined time, judges that the audio equipment is in an abnormal state and shuts off a power supplied to the audio output amplifier.

* * * * *